United States Patent [19]

Olmstead

[11] 4,410,857
[45] Oct. 18, 1983

[54] OPERATIONAL AMPLIFIER WITH FEED-FORWARD COMPENSATION CIRCUIT

[75] Inventor: John A. Olmstead, Somerville, N.J.

[73] Assignee: RCA Corporation, New York, N.Y.

[21] Appl. No.: 258,406

[22] Filed: Apr. 28, 1981

[51] Int. Cl.³ .............................................. H03F 3/45
[52] U.S. Cl. .................................... 330/253; 330/151; 330/255; 330/257
[58] Field of Search ................ 330/151, 253, 255, 257, 330/260

[56] References Cited

U.S. PATENT DOCUMENTS

| | | | |
|---|---|---|---|
| 4,132,958 | 1/1979 | Addis et al. | 330/252 |
| 4,208,635 | 6/1980 | Fazakerly et al. | 331/17 |
| 4,227,157 | 10/1980 | Davies et al. | 330/265 |
| 4,267,517 | 5/1981 | Iida et al. | 330/253 |

OTHER PUBLICATIONS

B. J. Hosticka, "Dynamic CMOS Amplifiers", *IEEE Journal of Solid-State Circuits*, vol. SC-15, No. 5, Oct. 1980, pp. 887–894.
Y. P. Tsividis et al, "An Integrated NMOS Operational Amplifier with Internal Compensation", *IEEE Journal of Solid-State Circuits*, vol. SC-11, No. 6, Dec. 1976, pp. 748–753.
D.A.T.A., Edition 25, Dec. 1980, pp. 185 and 541.

*Primary Examiner*—James B. Mullins
*Attorney, Agent, or Firm*—E. M. Whitacre; P. J. Rasmussen; C. A. Berard, Jr.

[57] ABSTRACT

An amplifying circuit comprises a differential amplifier receiving input signals and having first and second output connections to which the input and output connections of a current amplifier respectively connect. A transistor receives signals at its gate from the second output connection of the differential amplifier and has a capacitor connected between its input and output electrodes. A feed-forward circuit, responsive to signals at the first output connection of the differential amplifier, develops a feed-forward signal which is applied to the output electrode of the transistor and poled so as to reinforce the signals thereat. The feed-forward signals tend to cancel signals conducted through the capacitor at high frequencies where the transistor exhibits reduced gain.

9 Claims, 1 Drawing Figure

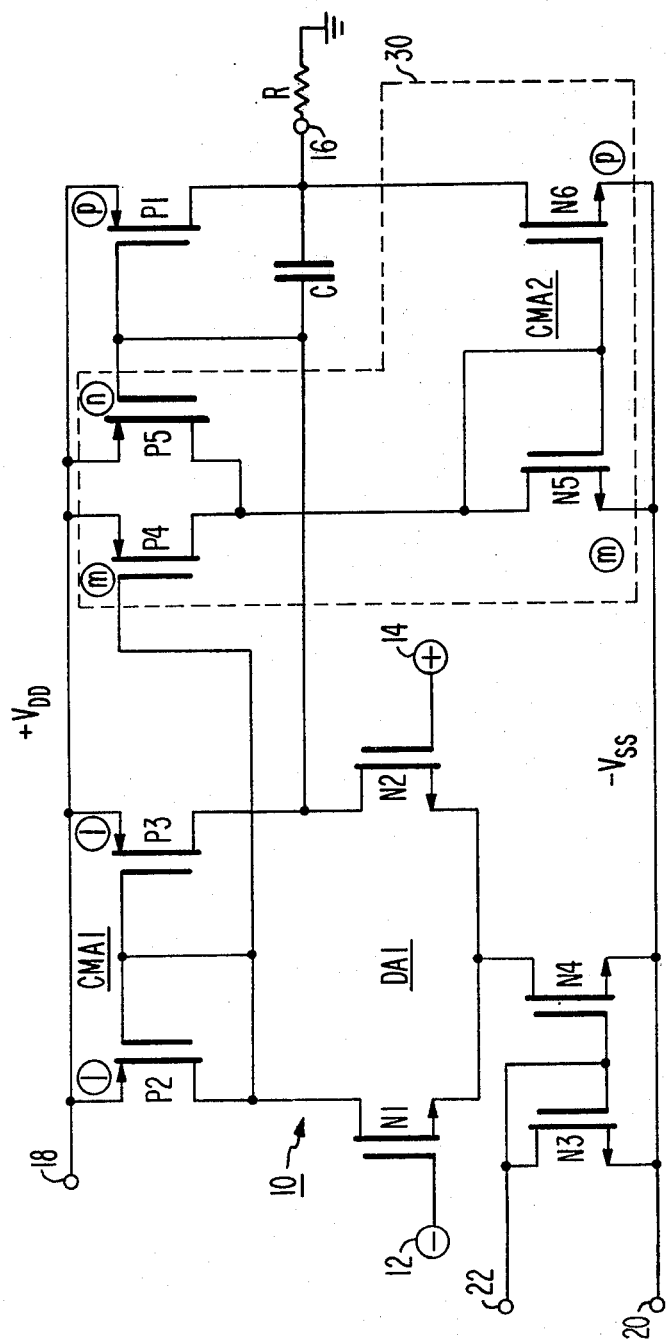

OPERATIONAL AMPLIFIER WITH FEED-FORWARD COMPENSATION CIRCUIT

The present invention relates to operational amplifiers and, in particular, to those employing a feed-forward circuit to modify their voltage gain-frequency characteristics.

Because operational amplifiers are often employed with a feedback connection between the output and at least one of their inputs, it is desirable that their gain and phase characteristics as a function of frequency be well controlled, for example, to avoid undesired oscillations. To the latter end, it is specifically desirable that the gain of the amplifier decrease at a uniform rate, typically −20 dB per decade (−6 dB per octave), as frequency increases. One convenient way to achieve that result in an inverting amplifier is to connect a capacitance between its input and output terminals. Unfortunately, at higher frequencies, where the impedance of the capacitance is low, input signals will "feed-forward" from the input terminal of the inverting amplifier to its output terminal. As a result, the amplifier effectively behaves as a non-inverting amplifier at those higher frequencies and the phase-frequency characteristic of the operational amplifier is undesirably modified so as to reduce its stability and thereby make undesirable oscillations possible.

One approach to avoiding such undesirable feed-forward of signal is to couple signals at the output terminal of the inverting amplifier to the capacitance through a follower-type amplifier, such as a source-follower configured field-effect transistor (FET) amplifier. So that the follower-type amplifier will apply a faithful reproduction of the output signal of the inverting amplifier to the capacitance, it is often necessary that the follower-type amplifier be biased to operate at a substantial quiescent current. This undesirably results in additional power consumption in the operational amplifier. An example of that approach is described by Y. P. Tsividis et al, "An Integrated NMOS Operational Amplifier with Internal Compensation", *IEEE JOURNAL OF SOLID-STATE CIRCUITS*, Vol. SC-11, No. 6, Dec. 1976, pp. 748–53.

An amplifying circuit according to the present invention comprises a differential amplifier having first and second input terminals for receiving input signals therebetween and having first and second output connections for supplying respective signals responsive to the input signals. An inverting amplifier has a common electrode connected to receive operating potential, an input electrode to which signals at the second output connection of the differential amplifier are coupled, and a capacitance coupled between its input and output electrodes. A feed-forward circuit develops a feed-forward signal in response to the signal at the first output connection of the differential amplifier and supplies the feed-forward signal to the output electrode of the inverting amplifier. The feed-forward circuit is poled for making the feed-forward signal reinforce signals developed by the inverting amplifier at its output electrode.

The sole FIGURE of the drawing is a schematic diagram of an embodiment according to the present invention.

Operational amplifier 10 has inverting input terminal 12 and non-inverting input terminal 14 at which input signals are received, and has output terminal 16 from which output signals are conducted to a load, shown by way of example as resistor R. Amplifier 10 receives relatively positive operating potential $+V_{DD}$ at supply terminal 18 and receives relatively negative operating potential $-V_{SS}$, which may be a reference potential such as ground, at supply terminal 20.

N-channel field-effect transistors (FETs) and N1 and N2 are connected as a differential amplifier DA1 receiving input signals from terminals 12 and 14 at their respective gates and supplying output signals at their respective drains. The drain-source conduction path of N-channel FET N4 is connected between the respective sources of N1 and N2 and supply terminal 20 for supplying a constant operating current to DA1. It is preferred that the constant current supplied by N4 be of sufficient magnitude that the FETs in amplifier 10 are biased to operate in the strong inversion (high current) region rather than in the weak inversion (very low current) region. That preference permits substantial current to be supplied to load R. N4 cooperates with FET N3 as will be explained below.

A current amplifier, shown by way of example as current mirror amplifier CMA1, includes P-channel FET's P2 and P3. The sources of P2 and P3 serve as the common terminal of CMA1 and connect to supply terminal 18. Their respective drains serve as the input and output connections of CMA1 and respectively connect to the drains of N1 and N2 for receiving signals therefrom. The potential at the input connection of CMA1 at the drain of N1 is applied to the respective gates of P2 and P3 to condition them for conduction.

P-channel FET P1 is connected as a common-source amplifier with its source connected to receive operating potential $+V_{DD}$, its gate connected to receive input signals from the drain of N2, and its drain connected to provide output signals to output terminal 16. FET P1 serves as an inverting amplifier. Capacitance C is connected between the drain and source of P1 to cause the gain-frequency characteristic of amplifier 10 to change at a uniform rate as described above.

As thus far described, amplifier 10 is susceptible to the undersirable effects resulting from the uncontrolled feed-forward of signal through capacitance C as described in the introduction hereof.

To circumvent those problems, feed-forward circuit 30 is introduced to develop a feed-forward signal responsive to the signal at the drain of FET N1 and supply that feed-forward signal to the drain of FET P1. That feed-forward signal is of opposite polarity sense to the signals developed by P1 at its drain so to reinforce them as will be described later.

Specifically, P-channel FET P4 is connected as a common-source amplifier with its source connected to operating potential $+V_{DD}$, its gate connected to receive signal from the drain of N1, and its drain connected to supply signal to CMA2. CMA2 includes N-channel FETs N5 and N6 are connected in conventional current mirror amplifier form. CMA2 has an input connection at the drain of N5 for receiving input signal from the drain of P4, and has an output connection at the drain of N6 for supplying the feed-forward signal to the drain of P1. The sources of N5 and N6 serve as the common connection of CMA2 which receives operating potential $-V_{SS}$. Potential at the drain of N5 is applied to the gates of N5 and N6 to condition them for conduction.

It is understood that P4 can also be considered as a further output circuit associated with CMA1. In that sense, CMA1 employs P2 as an input or master transistor, and employs P3 and P4 as respective output or slave transistors each of which supplies from its respective drain a current proportional to that conducted by P2.

The manner in which the signal reinforcement at output terminal 16 obtains is as follows. In response to differential signals applied between input terminals 12 and 14, differential signals are generated at the respective drains of N1 and N2. Those signals are of opposite sense with respect to each other, i.e. as one is increasing, the other is decreasing. For the purpose of description, the signal at the drain of N1 is designated as the "in-phase" signal and that at the drain of N2 is designated as the "out-of-phase" signal. Common-source amplifier transistor P1 receives out-of-phase signal at its gate and supplies an in-phase signal at output terminal 16. Being an inverting amplifier, P4 receives in-phase signal at its gate and supplies an out-of-phase signal at its drain. That out-of-phase signal is applied to output terminal 16 by CMA2 which introduces a polarity inversion so that its output signal is again an in-phase signal. Thus, the signals from both P1 and N6 at output terminal 16 are both in-phase and so will reinforce.

At higher frequency the in-phase signal supplied by P1 diminishes and the out-of-phase signal from the drain of N2 couples directly to output terminal 16 through capacitance C. That out-of-phase signal coupled through C is opposed by the in-phase signal supplied from feed-forward circuit 30 and tends to be cancelled thereby. It is understood that feed-forward circuit 30 provides a feed-forward signal that has a magnitude less than that of the signal supplied by P1. That is so because the resistance exhibited at the interconnection of the drains of N1 and P2 is relatively smaller than that exhibited at the interconnection of the drains of N2 and P3. The principal reason therefor is that the drain-source resistance of diode-connected transistor P2 is substantially lower than the drain-source resistance of common-source amplifier-connected transistor P3. Desirably, the feed-forward signal is of similar magnitude to the signal coupled to the drain of P1 through capacitance C at higher frequencies. As a result, signals at output terminal 16 tend to retain their in-phase sense owing to the signal supplied by N1. Thus, the undesirable phase reversal which would occur as a result of signal being conducted through capacitor C is avoided.

By way of modification to amplifier 10 as thus far described, P-channel FET P5, having its drain and source connected to like electrodes of FET P4 and having its gate connected to the gate of P1, can be included when it is desired to further diminish the magnitude of the feed-forward signal. P5 receives out-of-phase signal at its gate and supplies in-phase signal from its drain that is smaller than, and combines with, the out-of-phase signal from P4. Because signals from P4 and P5 oppose each other, the net out-of-phase signal applied to CMA2 is smaller than it would otherwise be. A specific construction of P5 so that its drain signal is smaller than that of P4 is explained below.

In addition to beneficially controlling the phase of signals at output terminal 16 in response to differential input signals, feed-forward circuit 30 also improves the common mode rejection characteristic of amplifier 10 as follows. A common-mode signal is the instantaneous algebraic average of two signals which are referred to a common reference. By comparison, a differential signal is the instantaneous, algebraic difference between two signals. Common-mode rejection is desirably maximized when differential gain is maximized and common-mode gain is minimized. FET N4 supplies constant current substantially unaffected by the common-mode voltage at terminals 12 and 14 to the source interconnection of N1 and N2 of DA1. Thus, the operating currents of DA1, as well as those of the remainder of amplifier 10, are unaffected by that common-mode voltage. As a result, amplifier 10 is substantially unresponsive to common-mode signals and so exhibits low common-mode voltage gain. Due to feed-forward circuit 30, amplifier 10 exhibits a lower gain in response to common-mode input signals applied at input terminals 12 and 14 that it otherwise would. This obtains as follows.

Assume a common-mode input signal which increases towards the potential $+V_{DD}$. In response, the respective potentials at the drains of N1 and N2 will decrease towards potential $-V_{SS}$ because N1 and N2 become more conductive. The decreasing drain potential of N2 appears as increasing gate-source potential at P1 causing it to become more conductive so that the potential at the drain of P1 tends to increase towards $+V_{DD}$. Similarly, the decreasing potential at the drain of N1 appears as increasing gate-source potential at P4 causing it to become more conductive so that the potential at the drain of P4 increases towards $+V_{DD}$. That increasing potential causes FETs N5 and N6 to become more conductive which in turn causes the potential at the drain of N6 to decrease towards the potential $-V_{SS}$. Therefore, because P1 is tending to increase the potential at output terminal 16 and N6 is tending to decrease that potential, the net result will be a diminished potential change at output terminal 16.

So that high differential gain may obtain and so that little additional current consumption will result from feed-forward circuit 30, the respective conductive channels of the various FETs can be selected of predetermined size. In FETs, the width-to-length (W/L) ratio of their conductive channel is related to its transconductance. In the FIGURE, the respective relative width-to-length ratios of the FETs are indicated by the encircled characters approximate to the source electrodes of each FET; P2 and P3 are designated as unit-ratio FETs for purposes of description. So that high gain may obtain, FET P1 is of conductive channel ratio "P" which is desirably selected to be greater than unity. N6, which also serves as a current-sink for the quiescent current of P1, is likewise of channel ratio "p". So that little operating current will flow in the serially connected drain-source paths of P4 and N5, they can be selected to have conductive channel areas "m" which are desirably less than unity. FET P5 is constructed with W/L ratio "n" where "n" is a value much smaller than "m". For example, so that the net signal at the interconnection of the drains of P4 and P5 will be out-of-phase as described above, it is desirable that the inequality $n \leq m/p$ be satisfied. P5 is therefore a small device and has insignificant effect on the overall operating current consumption of amplifier 10.

The approximate values $p=2$ and $m=1/5$ were found to provide satisfactory operation. It is noted that such relatively small values for the ratio "m" will require minimum additional chip area for P4 and P5 when amplifier 10 constructed as an integrated circuit, thereby not significantly increasing the overall chip area. In the constructed circuit, transistor N1 and N2 had relative W/L ratios of unity. Further, each of the four FETs N1, N2, P2 and P3 were constructed as a pair of transistors (eight transistors in total) connected in parallel, and were physically arranged on the integrated circuit chip in an inter-digitated arrangement so as to operate at susbstantially the same temperature. As a result, differences in their respectively gate-source potentials owing to differences in their operating temperatures are beneficially reduced so that amplifier 10 will require a substantially smaller potential to be applied between terminals 12 and 14 to establish a balanced condition in DA1 at which N1 and N2 conduct substantially equal portions of the current supplied by N4.

Modifications to the present invention as defined by the following claims are contemplated to be within the scope of the present invention. For example, operating current supplied to DA1 by FET N4 may be controlled to obtain particular characteristics for amplifier 10. To this end, N-channel FET N3 is connected in current mirror amplifier configuration with N4 to be responsive to programming signals applied at control terminal 22. Those control signals can be varied to control the quiescent operating point of amplifier 10 so as to control its gain and its bandwidth.

In the constructed circuit referred to above, the following values were satisfactory

| FET | W/L Ratio |
| --- | --- |
| N1, N2, P2, P3 | 2 each @ 12.4 = 24.8 |
| P1, N6 | 50 |
| P4 | 4.3 |
| N3 | 4 |
| N4 | 20 |
| N5 | 5 |
| and C was 4 picofarads. | |

What is claimed is:

1. An amplifying circuit including:
   differential amplifying means having first and second input terminals for receiving input signals therebetween, and having first and second output connections for supplying respective signals thereat, each of which signals includes a quiescent current portion and a portion responsive to said input signals, said differential amplifying means including constant current generating means for supplying said quiescent current;
   current mirror amplifying means having input and first output connections to which said first and second output connections of said differential amplifying means respectively connect, and having a common connection connected for receiving operating potential;
   a first transistor having input and output electrodes, and having a common electrode connected to receive said operating potential;
   capacitance means connected between the input and output electrodes of said transistor; and
   means for coupling signals at the second output connection of said differential amplifying means to the input electrode of said first transistor; wherein the improvement comprises:
   a further output connecton of said current mirror amplifying means, the current supplied by said further output connection being of lesser magnitude than the current supplied by first output connection thereof;
   further current mirror amplifying means having an input connection to which the further output connection of said current mirror amplifying means connects, having an output connection connected to the output electrode of said first transistor, and having a common connection connected for receiving a reference potential; and
   a second transistor of like conductivity type to that of said first transistor, having an input electrode to which signals at the second output connection of said differential amplifying means are coupled, having a common electrode connected to receive said operating potential, and having an output electrode connected to the further output connection of said current mirror amplifying means.

2. The amplifying circuit of claim 1 wherein said current mirror amplifying means comprises:
   third and fourth transistors of like conductivity type so that of said first transistor, having respective output electrodes connected to the input and output connections of said current mirror amplifying means, respectively, having respective common electrodes connected to the common connection thereof, and having respective input electrodes;
   means for applying a potential responsive to that at the input connection of said current mirror amplifying means to the respective input electrodes of said third and fourth transistors to condition them for conduction; and wherein said further output connection comprises;
   a fifth transistor of like conductivity type to that of said first transistor, having input and common electrodes respectively connected to the input and common electrodes of said third transistor, and having an output electrode serving as the further output connection of said current mirror amplifying means.

3. The amplifying circuit of claim 1 or 2 wherein said further current mirror amplifying means comprises:
   sixth and seventh transistors of complementary conductivity type so that of said first transistor, having respective output electrodes connected to the input and output connections of said further current mirror amplifying means, having respective common electrodes connected to the common connection thereof, and
   means for applying a potential responsive to that at the input connection of said further current mirror amplifying means to the respective input electrodes of said sixth and seventh transistors to condition them for conduction.

4. The amplifying circuit of claim 2 wherein said first, second, third, fourth, and fifth transistors are of field-effect type.

5. The amplifying circuit of claim 4 wherein said third and fourth transistors have respective conductive channels of a first width-to-length ratio, and wherein said first transistor has a conductive channel of width-to-length ratio larger than said first ratio.

6. The amplifying circuit of claim 5 wherein said fifth transistor has a conductive channel of width-to-length ratio smaller than said first ratio.

7. The amplifying circuit of claim 4 wherein said first, second and fifth transistors have respective conductive channels of width-to-length ratios of p, n and m, respectively, said ratios being selected so that n is less than m divided by p.

8. The amplifying circuit of claim 7 wherein said further current mirror amplifying means exhibits a current gain ratio substantially equal to p divided by m.

9. The amplifying circuit of claim 2 wherein said fifth transistor has a conductive channel of a first width-to-length ratio, and wherein said second transistor has a conductive channel of a width-to-length ratio smaller than said first ratio.

* * * * *